(12) United States Patent
Brinkhaus et al.

(10) Patent No.: US 8,885,348 B2
(45) Date of Patent: Nov. 11, 2014

(54) CIRCUIT BOARD SENSOR AND METHOD FOR PRODUCING THE SAME

(76) Inventors: Bernhard Brinkhaus, Oetwil an der Limmat (CH); Werner Waser, Winterthur (CH)

(*) Notice: Subject to any disclaimer, the term of this patent is extended or adjusted under 35 U.S.C. 154(b) by 151 days.

(21) Appl. No.: 13/636,560

(22) PCT Filed: Mar. 22, 2011

(86) PCT No.: PCT/EP2011/054383
§ 371 (c)(1),
(2), (4) Date: Nov. 28, 2012

(87) PCT Pub. No.: WO2011/117262
PCT Pub. Date: Sep. 29, 2011

(65) Prior Publication Data
US 2013/0063905 A1    Mar. 14, 2013

(30) Foreign Application Priority Data
Mar. 22, 2010 (EP) .................................. 10157258

(51) Int. Cl.
*H05K 1/03* (2006.01)
*H05K 1/00* (2006.01)
(Continued)

(52) U.S. Cl.
CPC ............... *H05K 1/02* (2013.01); *B81B 2207/07* (2013.01); *B81C 2201/019* (2013.01);
(Continued)

(58) Field of Classification Search
CPC ..... H05K 1/0306; H05K 1/185; H05K 3/368; H05K 3/4605; B81B 3/0021; B81B 2201/0264
USPC ............................. 361/748; 174/255; 29/592.1
See application file for complete search history.

(56) References Cited

U.S. PATENT DOCUMENTS 7,217,588 B2 *  5/2007  Hartzell et al. ................. 438/51

7,569,410 B2 *  8/2009  Hartzell et al. ................. 438/51
(Continued)

FOREIGN PATENT DOCUMENTS

WO    WO 2007/079072    7/2007

OTHER PUBLICATIONS

International Search Report for International Application No. PCT/EP2011/054383 mailed Dec. 21, 2011.

*Primary Examiner* — Jeremy C Norris
*Assistant Examiner* — Nathan Milakovich
(74) *Attorney, Agent, or Firm* — Pearl Cohen Zedek Latzer Baratz LLP

(57) ABSTRACT

The invention relates to a circuit board sensor (1) for measuring physical variables, comprising a substrate board (2) and a second board (3) both made of glass, wherein at least the second board (3) is designed such that said board is elastically deformable, wherein the substrate board (2) and the second board (3) each comprise a first and a second side (2a, 2b, 3a, 3b), wherein the second side (2b) of the substrate board (2) and the first side (3a) of the second board (3) are disposed opposite each other, and wherein a spacer element (7) is disposed between the substrate board (2) and the second board (3) and holds the substrate board (2) and the second board (3) at a mutual distance, wherein the substrate board (2) and the second board (3) extend in particular parallel to each other, wherein the second side (2b) of the substrate board (2) comprises a first metal or polymer surface (5a) and the first side (3a) of the second board (3) comprises a second metal or polymer surface (5b), and wherein the first and second metal or polymer surfaces (5a, 5b) are disposed at least partially opposite each other, and wherein conductors (4) are attached on the first side of the substrate board (2), and wherein the substrate board (2) comprises at least one first and one second through-plating (9) disposed such that the first through-plating (9a) electrically conductively connects the conductors (4) to the first metal or polymer surface (5a), and such that the second through-plating (9b) electrically conductively connects the conductor (4) to the second metal or polymer surface (5b).

22 Claims, 2 Drawing Sheets

Figure 1:
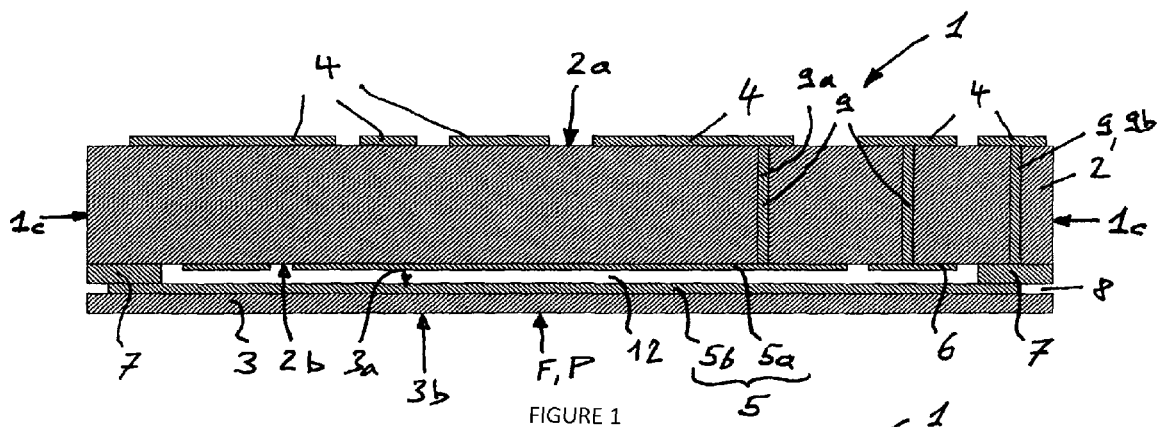

(51) Int. Cl.
  *B81B 3/00*  (2006.01)
  *H05K 1/02* (2006.01)
  *G01R 3/00* (2006.01)

(52) U.S. Cl.
  CPC ....... *B81B 3/0021* (2013.01); *B81B 2201/0264* (2013.01); *G01R 3/00* (2013.01)
  USPC .......................... 361/748; 174/255; 29/592.1

(56) References Cited

U.S. PATENT DOCUMENTS

| | | | |
|---|---|---|---|
| 7,591,185 B1* | 9/2009 | Mothilal et al. ................ | 73/718 |
| 7,918,019 B2* | 4/2011 | Chang et al. .................... | 29/846 |
| 2008/0165139 A1* | 7/2008 | Hotelling et al. .............. | 345/173 |
| 2011/0026202 A1* | 2/2011 | Kai et al. ................. | 361/679.01 |
| 2012/0267245 A1* | 10/2012 | Chambers et al. ........... | 204/400 |
| 2012/0274602 A1* | 11/2012 | Bita et al. ...................... | 345/174 |
| 2012/0319966 A1* | 12/2012 | Reynolds ..................... | 345/173 |
| 2013/0049844 A1* | 2/2013 | Bita et al. ...................... | 327/517 |
| 2013/0050155 A1* | 2/2013 | Petersen et al. ............... | 345/204 |
| 2013/0050226 A1* | 2/2013 | Shenoy et al. ................. | 345/501 |
| 2013/0106712 A1* | 5/2013 | Cummings et al. ........... | 345/173 |
| 2013/0126325 A1* | 5/2013 | Curtis et al. ................. | 200/5 A |
| 2013/0127879 A1* | 5/2013 | Burns et al. .................. | 345/501 |
| 2013/0293482 A1* | 11/2013 | Burns et al. .................. | 345/173 |
| 2013/0320803 A1* | 12/2013 | Maeda ......................... | 310/300 |

\* cited by examiner

CIRCUIT BOARD SENSOR AND METHOD FOR PRODUCING THE SAME

CROSS REFERENCE TO RELATED APPLICATIONS

This application is a National Phase Application of PCT International Application No. PCT/EP2011/054383, International Filing Date Mar. 22, 2011, claiming priority of European Patent Application No. 10157258.4, filed Mar. 22, 2010, which is hereby incorporated by reference.

The present invention relates to a circuit board sensor. The present invention further relates to a method for the manufacture of a circuit board sensor.

STATE OF THE ART

The present invention relates to the field of electronic measurements of physical parameters, such as e.g. pressure, force or acceleration.

The field of sensor technology is a very broad field. To date sensors can be constructed for the most diverse measurement tasks. This relates, on the one hand, to the parameter to be measured by the sensor and, on the other hand, to the conditions to be satisfied by the sensor. The parameters to be measured are typically physical parameters or chemical parameters. The conditions to be satisfied change depending on the field of application of the sensor and can lead to completely different types of construction for an individual sensor.

The purpose of a sensor is the transformation of physical parameters or chemical parameters into an electric signal. This in turn can be detected by electronic, electric and/or mechanical systems and can thereby be processed. The electric signal generated by the sensor can in this respect be present in different forms.

For transforming physical parameters into electric parameters different techniques and technologies are used today. In the majority of cases the sensor is an element and frequently a signal processing switched down-stream of the sensor is also required, which, on the one hand, serves the purpose of reducing undesired side influences and, on the other hand, to provide this signal at a standardized basis. If a signal processing circuit is connected downstream of the sensor then one frequently talks of a so-called transmitter today.

Although a plurality of sensors are known there is still the demand for more cost effective, reliable and robust sensors.

SUMMARY OF THE INVENTION

It is the object of the invention to provide an economically advantageous sensor. The sensor should, in particular be manufacturable very cost effectively and preferably also be very robust and reliable.

This object is satisfied by a sensor having the features of claim 1.

This object is in particular satisfied by a circuit board sensor for measuring physical parameters, comprising a base plate as well as a second plate which are both composed of glass, wherein at least the second plate is designed such that it is elastically deformable, wherein the base plate as well as the second plate each have a first and second side, wherein the second side of the base plate as well as the first side of the second plate are arranged opposite to one another and wherein a spacer element is arranged between the base plate and the second plate which spacer element maintains the base plate as well as the second plate at a mutual spacing, wherein the base plate and the second plate are in particular mutually parallel, wherein the second side of the base plate has a first metallic or polymeric surface and the first side of the second plate has a second metallic or polymeric surface, and wherein the first and second metallic or polymeric surface are at least partially arranged opposite one another and wherein conductive paths are applied at the first side of the base plate and wherein the base plate has at least a first and a second through contact, which are arranged such that the first through contact electrically conductively connects the conductive path to the first metallic or polymeric surface and such that the second through contact electrically conductively connects the conductive path to the second metallic or polymeric surface.

The term "metallic or polymeric surface" is understood, on the one hand, to mean a metallic or polymeric layer which is applied at the base plate and/or at the second plate and, on the other hand, also as the surface forming this layer.

The dependent claims 2 to 18 relate to further advantageously designed circuit board sensors.

The object is further more satisfied by a method for the manufacture of sensors having the features of claim 19.

The object is further satisfied by a method for the production of a circuit board sensor for measuring physical parameters, in which a base plate composed of glass is provided with conductive paths at the first side and is provided with at least a first metallic or polymeric surface at the second side, and wherein the first metallic or polymeric surface is connected to at least one conductive path via at least one through contact, and wherein a second plate composed of glass is provided at least with a second metallic or polymeric surface at the first side, and wherein the base plate as well as the second plate are connected to one another with the aid of spacer elements and/or of conductive paths such that the first metallic of polymeric surface of the base plate as well as the second metallic of polymeric surface of the second plate extend spaced apart from one another in particular in parallel and mutually spaced apart, wherein the base plate as well as the second plate are preferably designed congruently.

The dependent claims 20 to 22 relate to further advantageous method steps.

The circuit board sensor in accordance with the invention as well as the method in accordance with the invention have the advantage that the sensors can be manufactured directly with the aid of the manufacturing process for conducting paths and are manufactured as a part of the conductive path in standard production processes. This allows the productions of the sensors to be very cost effective and very reliable.

A further advantage can be seen therein that, amongst other things, the manufacturing cost for the sensors and the evaluation unit is very cost effective through the integration of different technologies and properties of measurement transformers. It was recognized that the circuit board production techniques present today permit an integration as well as a layered assembly of whole sensors, wherein these manufacturing processes are very well reproducible and are suitable for the manufacture of a large series production. Therefore it is possible to produce the sensors in very large numbers and at the same time in a very cost-effective manner. Thus, for example, it is possible to manufacture 300 to 1000 sensors in a first method step at the same time on the same base plate in order to then separate these base plates such that the sensors are present individually. During the method in accordance with the invention the sensors as well as the conductive paths are manufactured in a layered construction. An advantage of the sensor in accordance with the invention respectively of the method of production in accordance with the invention is to be seen therein that the substrate and/or the layered construction and/or the material composition and/or the geometry of the conductive path can be varied very easily, cost-effectively and, in particular also in a plurality of design forms and that it is possible to produce also different types of construction of the sensors cost-effectively and in large numbers.

The sensor in accordance with the invention can be designed for measuring a plurality of physical parameters, in particular pressure, force or acceleration. The sensor in accordance with the invention can be supplemented in an advantageous embodiment such that additional measurement parameters can be detected and, for example, a measurement of chemical parameters is possible.

For the circuit board sensor in accordance with the invention the sensors and their evaluation electronics are preferably integrated at the circuit board. In this respect, the substrate, the layer construction, the material composition, the geometry of the circuit board as well as the arrangement of the electrically conducting paths can be selected from the most different types, amongst other things, also dependent on the physical or chemical parameters to be transformed. Beside the physical parameters it is additionally possible to also measure a plurality of chemical parameters.

The assembly in accordance with the invention has the advantage that the sensor technologies, housing technologies and circuit board technologies are quasi integrated into a single component or into a uniform component group which enables a reliable and cost-effective manufacture. Furthermore, this arrangement brings about a reduction of interfering influences which is why a reliable measurement parameter determination is possible. The integration moreover leads to very small sensors. Thus, it is also posBible to form a sensor and, in particular also a plurality of sensors, such as multi-sensor structures with comprehensive evaluation electronics, on a single circuit board structure. Furthermore, the shape of the sensor can be advantageously designed so that this can have a particularly advantageous shape for the respective application, so that the sensor is simply matched to the respective application and can be expediently designed through a suitable choice of the geometry of the circuit board structures.

The circuit board sensor in accordance with the invention comprises a base plate as well as a second plate, wherein the base plate and the sec- and plate are mutually spaced apart, so that an intermediate space or an inner space is formed there between. In an advantageous embodiment, the base plate and/or the second plates are coated with a transparent layer or at least with a partially transparent layer which layer forms the first and/or the second metallic or polymeric surface. Moreover, the base plate and/or the second plate are formed from a transparent or at least partially transparent glass. The at least partially transparent layer and the at least partially transparent glass bring about the advantage that the inner space can be viewed from the outside through a corresponding selection of the transparency, since the inner space is visually recognizable on observation of the base plate and the second plate. In a particularly advantageous embodiment, a display apparatus is arranged in the inner space, for example, a digital display, an analog display or a screen, which display apparatus can be recognized and from which one can be read on observation of the base plate and/or the second plate. The digital display can, for example, be designed as an LED display, as an LCD display or a generally light-emitting display. An analog display can, for example, be designed as a pictogram, for example an on-off display or as a movable pointer or as a clock which is equipped with several hands.

SHORT DESCRIPTION OF THE DRAWINGS

Figure 2:
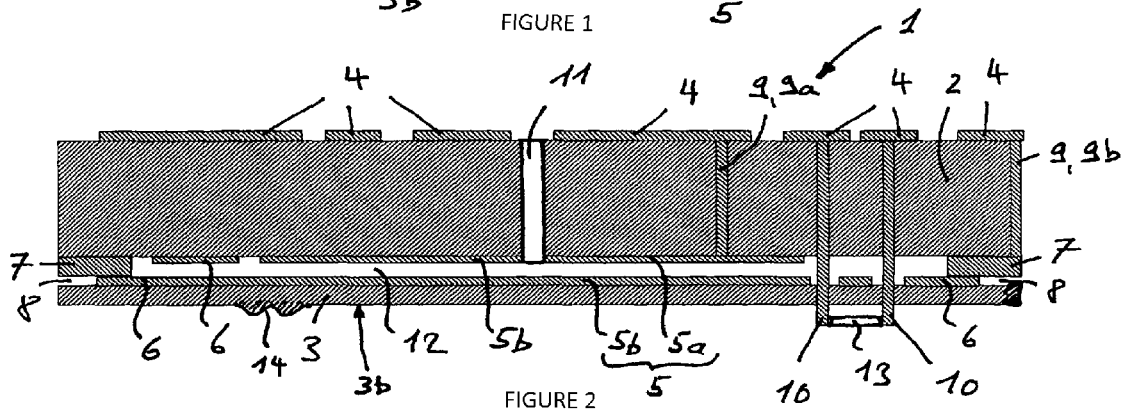
Figure 3:
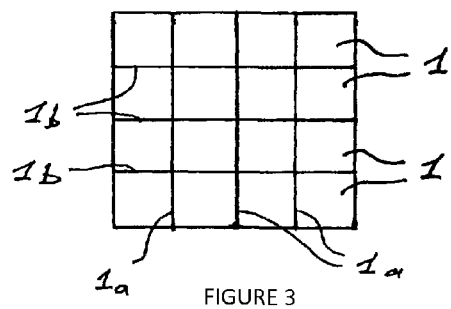
Figure 4:
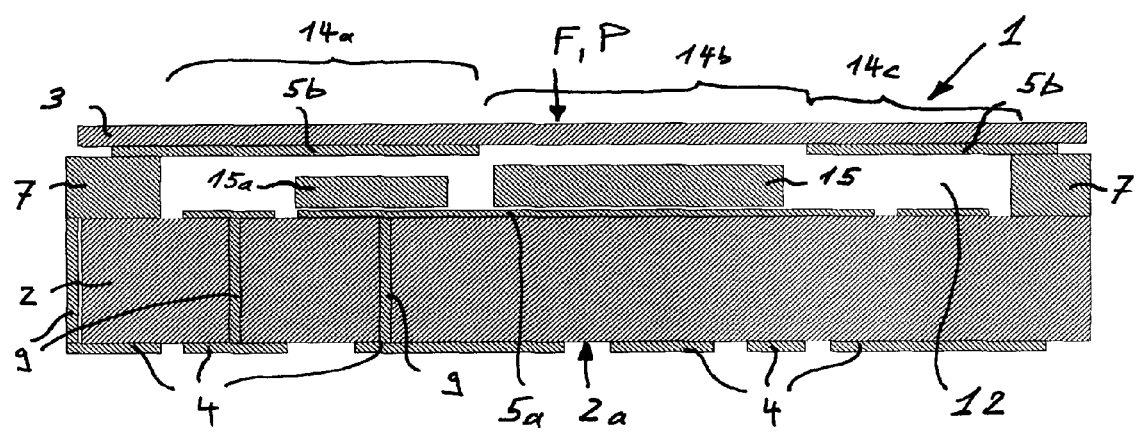
Figure 5:
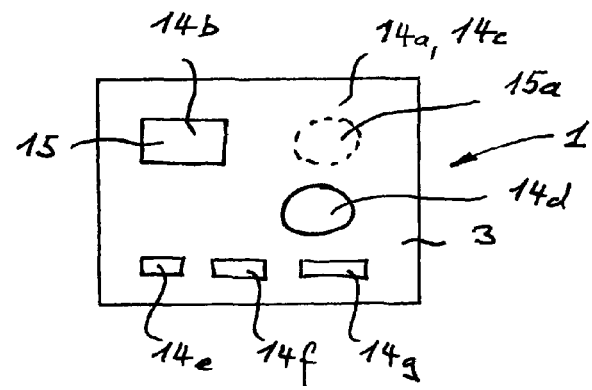

The drawings used for the explanations of the embodiments show:

FIG. 1 a longitudinal section through a first embodiment of a circuit board sensor;
FIG. 2 a longitudinal section through a second embodiment of a circuit board sensor;
FIG. 3 a top view of a plurality of not yet separated sensors;
FIG. 4 a longitudinal section through a further embodiment of a circuit board sensor;
FIG. 5 a top view of the second plate of a sensor.

In principle, the same parts are referred to with the same reference numerals in the drawings.

WAYS OF CARRYING OUT THE INVENTION

FIG. 1 shows a longitudinal section through a circuit board sensor 1 for the measurement of physical parameters. The circuit board sensor 1 comprises a base plate 2 as well as a second plate 3 which are both composed of a glass. At least the second plate 3 is designed such that this can be elastically deformed. The base plate 2 as well as the second plate 3 each have a first and a second side 2a, 2b, 3a, 3b, wherein the second side 2b of the base plate 2 as well as the first side 3a of the second plate 3 are arranged opposite one another and wherein a spacer element 7 is arranged between the base plate 2 and the second plate 3 which spacer element 7 maintains the mutual spacing between the base plate 2 as well as the second plate 3, wherein the base plate 2 and the second plate 3 are preferably mutually parallel. The second side 2b of the base plate 2 has a first metallic or polymeric surface 5a and the first side 3a of the second plate 3 has a second metallic or polymeric surface 5b, and wherein the first and second metallic or polymeric surface 5a, 5b are at least partially arranged opposite one another. The two metallic or polymeric surfaces 5a, 5b are electrically conductive and can, for example, form a capacitor 5, whose capacity changes due to the force F acting on the second plate 3 or due to the pressure P acting on the second plate 3 which brings about a mutual displacement of the surfaces 5a, 5b and thus a change of the capacitance. The surfaces 5a, 5b can, for example, also be designed as coils, or as inductances whose interaction changes due to a deflection of the second plate 3 and/or of the base plate 2. In an advantageous embodiment, the circuit board sensor 1 furthermore comprises a reference sensor which is designed by the conductor path 6 and a part of the surface 5b in accordance with FIG. 1 in the illustrated embodiment. The conductor path 6 is connected to a conductor path 4 via a through contact 9. The through contact is, for example, formed by drilling. The circuit board sensor 1 illustrated in FIG. 1 can also have a plurality of capacitive sensors and/or inductive sensors which are preferably arranged at the second side 2b of the base plate 2 and at the first side 3a of the second plate 3.

Conductive paths 4 are provided at the first side of the base plate 2, wherein the base plate 2 comprises at least a first and a second through contact 9 which are arranged such that the first through contact 9a electrically conductively connects the conductor path 4 to the first metallic or polymeric surface 5a and such that the second through contact 9b electrically conductively connects the conductive path 4 to the second metallic or polymeric surface 5b. The conductive paths 4/6/7 are preferably arranged extending at the first side 2a or at the second side 2b such that electronic components, such as electronic circuits can be connected to these.

In a preferred embodiment, the through contacts extend as illustrated in FIG. 1 through the glass of the base plate 2, wherein the through contact 9 is preferably flush with the first and second side 2a, 2b of the base plate 2 as illustrated. Preferably, a bore is initially carried out in the glass which bore is then preferably filled with metal or a metal is introduced into this in order to thus form a through contact 9. The through contact 9 can, however, as illustrated in FIG. 2 also extend along the surface of the glass of the base plate 2.

The spacer element 7 can be designed as a conductive path 6.

In an advantageous embodiment, the spacer element 7 and/or the conductor paths 6 are arranged such that a gap 8 is formed at the outer edge 1c between the base plate 2 and the second plate 3. Amongst other things, this gap 8 has the advantage that the second plate 3 can be more easily bent.

In an advantageous embodiment the spacer element 7 and/or the conductor paths 6 are arranged such that the base plate 2 as well as the second plate 3 are surrounded such that an enclosed inner space 12 is formed between the base plate 2 and the second plate 3.

FIG. 2 shows a longitudinal section through a second embodiment of a circuit board sensor 1 for the measurement of physical parameters. The base plate 2 has a fluid permeable throughput 11 which extends from the first side 2a into the inner space 12 and thus forms a fluid permeable connection between the inner space 12 and the outer space.

The circuit board sensor 1 can moreover still comprise additional sensors. As is illustrated in FIG. 2, the circuit board sensor 1 can comprise at least a second sensor 13 which is, for example, arranged at or above the second side 3b of the second plate 3, wherein the sensor 13 is connected to conductor paths 4 in a signal conducting manner via electric conductors 10 which conductor paths 4 are arranged at the first side 2a of the base plate 2. The sensor 13 can, for example, be designed as a chemical sensor and, for example, be composed of carbon which changes the conductivity in dependence of the $CO_2$ concentration, so that the $CO_2$ concentration can be measured.

The circuit board sensor 1 in accordance with the invention can be designed in a plurality of ways and, if required, also comprise a plurality of sensors. Depending on the required evaluation electronics, one or more insulation layers and/or conductor path planes 4 can be applied at the surface and/or above or below the base plate 2 in order to enable the electric connections to the electronic components. The required connections to the sensors are preferably generated by through contacts 9, wherein the through contacts 9 preferably extend through the glass.

FIG. 1 schematically shows an embodiment of a circuit board sensor 1 for the detection of physical and chemical parameters. The circuit board sensor 1 has a round or polygonal, in particular a quadratic planar geometry. Chemical or physical sensor elements can be arranged both at the upper side 2a and also at the underside 2b of the base plate. Preferably passive, flat electronic components can be used, such as resistors, coils or capacitors or others which change their electrical properties due to influences e.g. of oxygen or of $CO_2$ or other chemical materials for the chemical sensor elements 13. Likewise physical sensors 5 can also be arranged at least at one side of the base plate 2 which are formed in combination with the second plate 3. A mechanical influence F, P at the second plate 3 brings about a change of an electrical parameter of the physical sensor 5.

The circuit board sensor 1 is preferably formed in large series plants, in that a plurality of sensors 1, for example 300 to 1000 sensors 1 are produced at a common base plate 2 and/or at a common second plate 3. FIG. 3 shows a top view of a plurality of not yet separated sensors 1 which are separated in a subsequent method step along the separation lines 1a, 1b, for example, by slitting or milling. The sensors 1 can, if required, moreover be equipped with electronic components before these are separated from one another. Thus, a plurality of sensors 1 can be manufactured simultaneously at a common plate and furthermore very cost-effectively. Following the completion, the individual sensors 1 can be separated from one another, preferably by automatic separation methods.

The circuit board sensor 1 for the measurement of physical parameters is preferably produced such that a base plate 2 composed of glass is provided at the first side 2a with conductor paths 4 and at least a first metallic or polymeric surface 5a is provided at the second side 2b, wherein the first metallic or polymeric surface 5a is connected to a conductor path 4 via at least one through contact 9, and wherein a second plate 3 composed of glass is provided at the first side 3a at least with a second metallic or polymeric surface 5b, and wherein the base plate 2 as well as the second plate 3 are connected to one another with the aid of spacer elements 7 and/or conductor paths 6 such that the first metallic or polymeric surface 5a of the base plate 2 as well as the second metallic or polymeric surface 5b of the second plate 3 extend spaced apart from one another in particular in parallel and mutually spaced apart. The base plate 2 as well as the second plate 3 are preferably designed identical to one another and arranged congruent with one another.

A plurality of circuit board sensors 1 is preferably generated at a common base plate 2 as well as at a common second plate 3 in planigraphy, wherein the circuit board sensors 1 are separated from one another after their manufacture.

Advantageously, the base plate 2 and the second plate 3 of each circuit board sensor are connected to one another mutually via spacer elements 7 and/or conductor parts 6 such that a gap 8 is formed at the outer edge 1c of the circuit board sensor 1 between the base plate 2 and the second plate 3.

In a further advantageous embodiment, the surface 3b of the second plate 3 can have a surface structure 14, as is illustrated by way of example in FIG. 2 along a short section, which surface structure 14 is, for example, designed as a surface provided with bulges or grooves. This structure 14 can, for example, be formed by a mechanical processing, for example, by means of milling. Such a structure 14 can, for example, be advantageous when the pressure of a fluid is to be measured with the circuit board sensor 1, wherein the fluid is guided such that this flows along the side 3b provided with a structure 14. However, also other or further sides 2a, 2b, 3a, 3b of the second plate 3 or of the base plate 2 can be provided with a surface structure 14.

FIG. 4 shows a longitudinal section through a further circuit board sensor 1. In contrast to the circuit board sensor 1 illustrated in FIG. 1, the circuit board sensor illustrated in FIG. 4 has a higher inner space 12 in which the spacer element 7 has a larger construction height. Moreover, display apparatuses 15, 15a are arranged in the inner space 12. Furthermore, the sensor 1 has a window region 14b with an at least partially transparent glass so that the display apparatus 15 arranged there beneath or at least the display illustrated thereon is visible on observation of the second plate from the outside. Furthermore, the sensor 1 has a window region 14a with an at least partially transparent glass and an at least partially transparent metallic or polymeric surface 5b, so that the display apparatus 15a arranged there below or the display illustrated at least partly thereon is visible on observation of the second plate 3 from the outside.

In a particularly advantageous embodiment, the second plate 3 is coated with a transparent or at least partly transparent layer 5b which forms the second metallic or polymeric surface 5b. Furthermore, the second plate 3 is formed from a transparent or at least partly transparent glass. The at least partly transparent metallic or polymeric surface 5b and the at least partly transparent glass bring about the advantage that either the inner space can be observed from the outside, since the inner space 12 and the display apparatus 15, 15a can be visually recognized or in that at least the display illustrated by the display apparatus 15, 15a can be recognized on observation of the second plate 3. The display apparatus 15, 15a is advantageously designed as a light emitting display, such as, for example, a digital display, an analog display or a screen. In a further advantageous embodiment, indicators can also be used for the analog display, for example, mechanical indicators such as those which are used for a speedometer or for a clock. The display apparatus 15 can furthermore comprise a drive apparatus in order to move the indicators, for example, the hands of a clock. The display apparatus for the indicators, can also be arranged within the base plate 2 or beneath the base plate 2. the circuit board sensor 1 in accordance with the invention is thus additionally provided with a display apparatus 15, 15a in a particularly advantageous embodiment. The second metallic surface 5b can, for example, be formed as thin transparent metallic coating which, for example, can be manufactured with the aid of a sputter deposition process.

FIG. 5 shows a top view of the circuit board sensor 1 or alternatively of the second plate 3. The second plate 3 is formed from a transparent glass. The second plate 3 has a plurality of window regions 14b, 14d, 14e, 14f, 14g, wherein the window region 14b, 14d, 14e, 14f, 14g are designed such that the second plate 3 has no transparent second metallic or polymeric surface 5b in this region or has a transparent second metallic or polymeric surface 5b in this region. The inner space 12 and a possibly therein arranged display apparatus 15 are visible from the outside through the window regions 14b, 14d, 14e, 14f, 14g.

The sensor 1 illustrated in FIG. 5 furthermore has a window region 14a, 14c with an at least partially transparent glass and an at least partially transparent metallic or polymeric surface 5b so that the contour of the display apparatus 15a is not visible, wherein the display of the display apparatus 15a is visible from the outside when this glows. The window region 14a, 14c can, however, also have a non-transparent glass and/or a non-transparent metallic or polymeric surface 5b, so that only the window region 14b, 14d, 14e, 14f, 14g are at least partially or completely of transparent design.

The sensor 1 is illustrated rectangular or quadratically in the illustrated Figures. The sensor 1 can, however, also have a round outer contour in the top view illustrated in FIG. 5 and can, for example, be circular-shaped, oval-shaped or of a polygonally extending design. The sensor 1 can be manufactured with a plurality of possible outer contours. Furthermore, the sensors can be manufactured in a plurality of possible colors. Moreover, the display apparatus 15, 15a permits a plurality of display possibilities. For this reason, sensor 1 is also suitable as a jewelry article or as a fashion article.

The invention claimed is:

1. A circuit board sensor for measuring physical parameters, comprising
a base plate as well as a second plate which are both composed of glass,
wherein at least the second plate is designed such that it is elastically deformable,
wherein the base plate as well as the second plate each have a first side and a second side
wherein the second side of the base plate as well as the first side (3a) of the second plate are arranged opposite to one another and wherein a spacer element is arranged between the base plate and the second plate which maintains the base plate as well as the second plate at a mutual spacing,
wherein the base plate and the second plate are in particular mutually parallel,
wherein the second side of the base plate has a first metallic or polymeric surface and the first side of the second plate has a second metallic or polymeric surface, and wherein the first and second metallic or polymeric surfaces are at least partially arranged opposite one another,
wherein conductive paths are provided at the first side of the base plate, and
wherein the base plate has at least a first and second through contact which are arranged such that the first through contact electrically conductively connects the conductive path to the first metallic or polymeric surface, and such that the second through contact electrically conductively connects the conductive path to the second metallic or polymeric surface.

2. A circuit board sensor in accordance with claim 1, wherein the trough contacts run through the glass of the base plate, wherein the through contact is in particular flush with the first and second side of the base plate.

3. A circuit board sensor in accordance with claim 1, wherein the through contacts extend along the surface of the glass of the base plate.

4. A circuit board sensor in accordance with claim 1, wherein the conductive paths are arranged extending such that an electric circuit can be connected thereto.

5. A circuit board sensor in accordance with claim 1, wherein the first and second metallic or polymeric surfaces form a capacitance and/or an inductance.

6. A circuit board sensor in accordance with claim 1, wherein the spacer element is designed as a conductive path.

7. A circuit board sensor in accordance with claim 6, wherein the spacer element and/or the conductive path are arranged such that a gap is formed at the outer edge between the base plate and the second plate.

8. A circuit board sensor in accordance with claim 6, wherein the spacer element and/or the conductive path surround the base plate as well as the second plate such that an enclosed inner space is formed between the base plate and the second plate.

9. A circuit board sensor in accordance with claim 8, wherein the base plate has a fluid permeable through passage which extends from the first side to the inner space.

10. A circuit board sensor in accordance with claim 1, wherein the base plate and the second plate are of congruent design.

11. A circuit board sensor in accordance with claim 1, wherein the base plate and/or the second plate has recesses, bores, outer edges or separation lines which are produced in particular by a mechanical machining such as slitting, drilling or milling.

12. A circuit board sensor in accordance with claim 1, wherein at least a second sensor is arranged at or above the second side of the second plate, wherein this sensor is connected to the conductive paths in a signal conducting manner via electric conductors which conductive paths are arranged at the first side of the base plate, and wherein the sensor is designed as a chemical sensor.

13. A circuit board sensor in accordance with claim 1, wherein the glass of the second plate and the second metallic or polymeric surface is transparent or is designed at least partially transparent.

14. A circuit board sensor in accordance with claim 1, wherein an inner space is formed between the base plate and the second plate, and in that a display apparatus is arranged in this inner space.

15. A circuit board sensor in accordance with claim 14, wherein the display apparatus is designed as a digital display apparatus or as an analog display apparatus or as a screen.

16. A circuit board sensor in accordance with claim 14, wherein the second plate has at least one window region, wherein the window region is designed such that the second plate has no transparent second metallic or polymeric surface in this region or has a transparent second metallic or polymeric surface in this region.

17. A circuit board sensor in accordance with claim 16, wherein the display apparatus is arranged below a window region.

18. A circuit board sensor in accordance with claim 1, wherein the second metallic or polymeric surface is transparent or is designed at least partially transparent.

19. A method for the production of a circuit board sensor for measuring physical parameters, comprising
a base plate composed of glass is provided with conductive paths at the first side and is provided with at least a first metallic or polymeric surface at the second side and wherein the first metallic or polymeric surface is connected to at least one conductive path via at least one through contact, and wherein a second plate composed of glass is provided with at least a second metallic or polymeric surface at the first side and wherein the base plate as well as the second plate are connected to one another with the aid of spacer elements and/or conductive paths such that the first metallic or polymeric surface of the base plate as well as the second metallic or polymeric surface of the second plate are arranged opposite one another, in particular are arranged in parallel to one another and mutually spaced apart, wherein the base plate as well as the second plate are preferably designed congruent with one another.

20. A method in accordance with claim 19, wherein a plurality of circuit board sensors are produced on a common base plate as well as on a common second plate in planigraphy; and in that the circuit board sensors are separated from one another after their production.

21. A method in accordance with claim 19, wherein the base plate and the second plate of each circuit board sensor are connected to one another via spacer elements and/or conductive paths such that a gap is generated at the outer edge of the circuit board sensor between the base plate and the second plate.

22. A method in accordance with claim 19, wherein the second metallic or polymeric surface is designed as an at least partially transparent layer.

* * * * *